United States Patent

Elliott et al.

[11] Patent Number: 5,956,612
[45] Date of Patent: Sep. 21, 1999

[54] TRENCH/HOLE FILL PROCESSES FOR SEMICONDUCTOR FABRICATION

[75] Inventors: Richard L. Elliott; John H. Givens, both of Meridian; Guy F. Hudson, Boise, all of Id.

[73] Assignee: MICRON Technology, Inc., Boise, Id.

[21] Appl. No.: 08/689,535

[22] Filed: Aug. 9, 1996

[51] Int. Cl.⁶ .................................................. H01L 21/441
[52] U.S. Cl. ........................ 438/637; 438/648; 438/653
[58] Field of Search ................................ 438/637, 648, 438/653, 675

[56] References Cited

U.S. PATENT DOCUMENTS

| | | |
|---|---|---|
| 3,380,657 | 4/1968 | Farrar .................................... 117/217 |
| 4,310,568 | 1/1982 | Howard et al. ........................ 427/84 |
| 4,502,209 | 3/1985 | Eizenberg et al. . |
| 4,796,082 | 1/1989 | Murakami et al. ..................... 357/71 |
| 4,897,709 | 1/1990 | Yokoyama et al. . |
| 5,066,611 | 11/1991 | Yu . |
| 5,262,354 | 11/1993 | Cote et al. . |
| 5,312,775 | 5/1994 | Fujii et al. ............................. 437/192 |
| 5,354,712 | 10/1994 | Ho et al. . |
| 5,358,616 | 10/1994 | Ward . |
| 5,401,675 | 3/1995 | Lee et al. . |
| 5,449,421 | 9/1995 | Hamajima et al. ................... 148/415 |
| 5,543,357 | 8/1996 | Yamada et al. . |
| 5,610,103 | 3/1997 | Xu et al. . |
| 5,633,200 | 5/1997 | Hu . |
| 5,668,054 | 9/1997 | Sun et al. . |

FOREIGN PATENT DOCUMENTS 4-107954   4/1992   Japan .

OTHER PUBLICATIONS

T. Iljima, et al. "Inlaid Cu Interconnects Employing Ti–Si–N Barrier Metal for ULSI Applications" IEICE Transactions on Electronics vol. E79–C No. 4. pp. 568–572. (abstract only), Apr. 1996.

*Primary Examiner*—Caridad Everhart
*Attorney, Agent, or Firm*—Workman, Nydegger & Seeley

[57] ABSTRACT

A contact space filled with conductive material having good step coverage is disclosed. The contact space is formed in a dielectric layer with an upper surface. The contact space has sidewalls comprised of the dielectric layer and a bottom comprised of an underlying layer. The contact space is filled by first depositing a layer of an amorphous material such as $TiAl_3$ over the bottom and sidewalls of the contact space, then filling the contact space with a metallic fill material such as an aluminum-containing fill material. The amorphous material is chosen particularly to have low reactivity with the metallic fill material, so that mobility of the metallic fill material over the surface upon which it is deposited is facilitated.

80 Claims, 1 Drawing Sheet

TRENCH/HOLE FILL PROCESSES FOR SEMICONDUCTOR FABRICATION

BACKGROUND OF THE INVENTION

1. The Field of the Invention

The present invention relates to the manufacture of semiconductor devices, and more particularly to the formation of contact structures such as contacts and vias that provide electrical contact to underlying structures. The present invention is particularly useful in the formation of high aspect ratio contact structures.

2. The Relevant Technology

As feature sizes in integrated circuits decrease, new technologies are required to produce functional structures with ever smaller dimensions. Methods for forming contact structures, which must often be formed in very high aspect ratio spaces (i e., ratio of depth to width >1), have become increasingly emphasized in semiconductor fabrication engineering.

Contact structures are typically formed by first creating a contact space in the form of a hole or trench in a dielectric layer, then filling the contact space with a conductive material by any number of methods, typically including sputter deposition, to form the contact structure.

Pure titanium or pure tungsten or other refractory metals are often currently used as a barrier layer between an aluminum-containing fill material and the inner surfaces of a contact space. While these films function well as barrier layers, they react with aluminum, which reaction has been found to inhibit the mobility along the inner surfaces of the contact space of the subsequently deposited aluminum-containing fill material. Such mobility has been found to play a significant role in adequately filling the contact space.

In filling high aspect ratio contact spaces, the fill material can often deposit more heavily at the opening of the contact space, so that the opening of the contact space is closed off before the bottom of the contact space is adequately filled. The likelihood of such problems only increases with the increasing aspect ratio. Methods to provide improved contact filling resulting in improved contact structures are thus needed.

SUMMARY OF THE INVENTION

In accordance with the present invention, a contact space is formed in a dielectric layer with an upper surface. The contact space has sidewalls comprised of the dielectric layer and a bottom comprised of an underlying layer. The contact space is filled by first depositing a layer of an amorphous material over the bottom and sidewalls of the contact space, followed by a step of filling the contact space with a metallic fill material. The amorphous material is chosen particularly to have low reactivity with the metallic fill material, so that mobility of the metallic fill material over the surface upon which it is deposited is facilitated.

Amorphous materials in the present invention are selected from the group consisting of metallics, ceramics, or intermetallics such as titanium aluminide and titanium silicide. Titanium silicide, $Ti_xSi_y$, can be in the range where x ranges from about 0.5 to 1.5 and y ranges from about 1.0 to 3.0. The preferred titanium silicide is $TiSi_2$ The preferred amorphous material as an intermetallic is $Ti_xAl_y$, where x ranges from about 0.5 to 1.5 and y ranges from about 1.0 to 3.0. The more preferred intermetallic is TiAl and the most preferred is $TiAl_3$. The preferred metallic fill material is aluminum, or doped or alloyed aluminum, such as Al—Cu, Al—Ge, Al—Si and Al—Cu—Si. If the fill material is doped or alloyed aluminum, a film of pure aluminum may optionally be deposited before filling with the alloy to further promote mobility along the inner surfaces of the contact space.

An adhesion promoting layer such as a layer of a refractory metal, for instance titanium, may optionally be deposited before the amorphous material. The adhesion layer of the present invention can also be TiN. Above and directly on the amorphous layer can be a flow-assisting layer of pure aluminum.

The metallic fill material may be deposited by various methods, including a two-stage deposition with a low temperature fast deposition followed by a high temperature slow deposition, a deposition followed by a pressure treatment, and a deposition followed by a post deposition anneal. An energy absorbing coating such as titanium nitride may optionally be used to increase the energy absorbed by the metallic fill material during an anneal.

The above briefly described method allows improved fill of contact spaces, giving more reliable contacts with lower resistivities even in small, high aspect ratio contact structures. The process steps of the method are easily performed in existing process equipment without significant special modifications.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention introduces the use of amorphous metallics, ceramics, or intermetallics, especially intermetallics such as TiAl and $TiAl_3$, as mobility-enhancing films for use in the formation of contact structures in semiconductor devices.

The present invention avoids inhibiting the mobility of a subsequently deposited metallic fill material by first depositing over the inner surfaces of a contact space a layer of an amorphous material having low reactivity with the subsequently deposited metallic fill material, as illustrated for example in FIG. 1.

Figure 1:
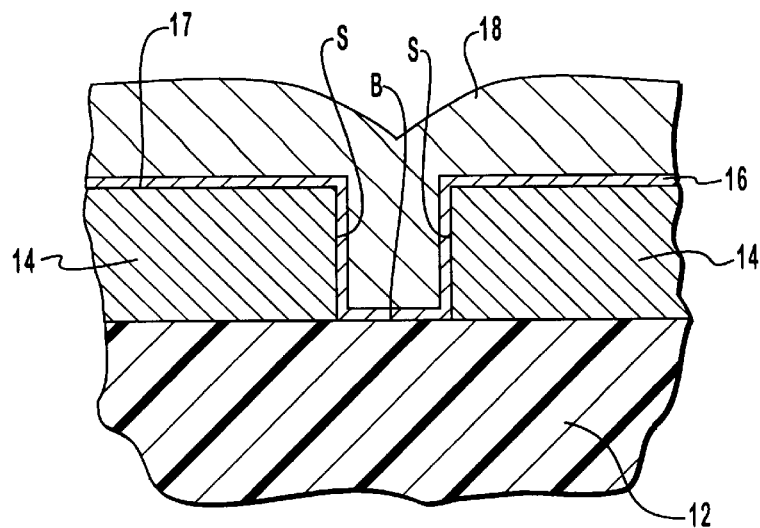
FIG. 1 is a partial cross section of a partially completed integrated circuit device showing layers used in the practice of the methods of the present invention.

FIG. 1 is a cross section of a partially completed integrated circuit device, including a dielectric layer 14 formed on an underlying layer 12. Dielectric layer 14 has an upper surface 17.

A contact space has been formed through dielectric layer 14 to underlying layer 12. Sidewalls S of the contact space are comprised of dielectric layer 14, while a bottom B of the contact space is comprised of underlying layer 12. Bottom B may alternatively be formed from dielectric layer 14 such that the contact space is formed entirely within dielectric layer 14.

Before the contact space in dielectric layer 14 was filled with a metallic fill material 18, a layer 16 of an amorphous material was deposited conformably over sidewalls S and bottom B of the contact space. The amorphous material was chosen so as to have little or no reactivity with metallic fill material 18. This allows metallic fill material 18 to more easily migrate during the deposition thereof along inner surfaces of the contact space such as sidewalls S, giving improved filling of high aspect ratio contacts.

Among amorphous materials to be used are metallics, intermetallics, ceramics, and their compounds. Metallics include pure metals, metal alloys, and otherwise pure metals that are doped with additional metals to form a doped alloy. Intermetallics include at least binary metals that behave similar to ceramics in brittleness at room temperatures but that behave similar to metals in ductility at high temperatures. Ceramics include more traditional ceramics based upon silicon as the central atom and nontraditional ceramics such a metal nitrides that do not include silicon as the metal component.

Although amorphous materials are mostly amorphous, it is recognized that there may be small inclusions ie. nano-structures of crystalline or polycrystalline materials interspersed in an otherwise amorphous structure. These materials are referred to as amorphous compounds, e.g metallic compounds, ceramic compounds, and intermetallic compounds, or generically as compounds and are to be considered part of the above metallics, ceramics, and intermetallic compounds. The occurrence of these compounds can be quantified by such techniques as XRD or equivalent methods.

Low reactivity can be quantified by observing both the degree of amorphousness of the amorphous material before and after filling the trench, and by selection of materials (amorphous material and the metallic fill material) that have endothermic reaction products, i.e. where the Gibbs free energy of the potential reaction products does not favor reaction. If the amorphous material has a high reactivity, it can be observed that a lumpy, micronrange sized reaction product has formed where the amorphous material used to be, whereas if the amorphous material has a low reactivity, it can be observed that virtually no reaction product has formed, although the degree of amorphousness of the amorphous material will have moved in the direction of having a crystalline morphology, as quantifiable by X-ray diffraction (XRD) or other suitable means known to the ordinary artisan. The reactivity can alternatively be quantified by kinetic parameters from empirical studies where for example the disappearance of amorphousness with respect to time at given conditions is proportional to the amount of amorphousness remaining at that time.

Although sputter depositing is the preferred method of depositing an amorphous material over the bottom and sidewalls, other methods can be used such as CVD, high-density plasma deposition, electroplating deposition, electrodeless plating deposition and equivalents.

Figure 2:
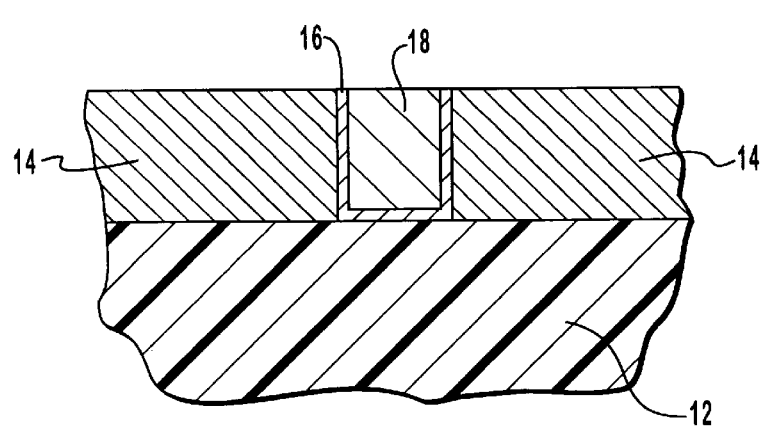
FIG. 2 is a cross section after further processing of the structure shown in FIG. 1.

After the contact space has been completely filled, the layers above upper surface 17 of dielectric layer 14 are removed, resulting in the structure shown in FIG. 2, with a finished contact structure comprised of layer 16 of the amorphous material and of metallic fill material 18. The step of removing the layers above upper surface 17 of dielectric layer 14 can be, for instance, an etch back step or a chemical mechanical polishing step.

The presently preferred metallic fill materials for use with the methods of the present invention are aluminum and aluminum alloys such as aluminum-copper, aluminum-silicon, and aluminum-silicon-copper.

The preferred amorphous materials are intermetallics such as AuAl, TiAl or most preferably $TiAl_3$ sputter deposited from targets of the same composition, though ceramics such as TaN, WN, TaAlN, and TIAlN or pure, alloyed, or doped metals may also be employed. To obtain a low reactivity the amorphous material is preferably an amorphous or virtually amorphous material and is preferably sputter deposited from a target of the same composition as the deposited film. Although we do not wish to be bound to any single theory we define the low reactivity quality as directly proportional to the thermodynamic and kinetic likelihood of potential reaction products to form as discussed above, and in degree of amorphousness of the amorphous material as deposited. We consider the discovery that the amorphous quality of the preferred materials, as sputtered, provides little or no crystalline reactive nucleation sites with the metallic fill material such that during the trench/hole fill process the chemically reactive interactions between the preferred materials and the metallic fill material are minimized.

The preferred amorphous materials are known for their eventual adhesion qualities to both the substrate and the metallic fill material. In the present invention this adhesion quality occurs only gradually during subsequent processing wherein the amorphous materials begin to form crystalline nucleation sites for chemical reactions with the metallic fill material and physical-chemical adhesion sites with the bottom and sidewalls such that pinning of the fill material occurs gradually. The degree of amorphousness of the preferred materials, as sputtered, can be measured by known techniques such as XRD such that an XRD scan that yields no peaks indicates virtually total amorphousness and exhibits the lowest reactivity for a given material.

Directional sputter deposition should be used from various directions to ensure both sidewall and bottom coverage. The resulting thickness of the deposited film of the amorphous material is preferably sufficient to provide coverage of sidewalls and bottom of the structure.

The deposition of the metallic fill material may be performed in any suitable way, and may include various methods of enhancing the filling of the contact space. For example, the fill material may be sputter deposited in a two step process, with a first layer of the metallic fill material being deposited at a "cold" temperature (for Al alloys this is less than about 200° C.) followed by sufficient metallic fill material to fill the contact space being deposited at a "hot" temperature (for Al alloys this is greater than about 200° C.). The lower temperature first layer wets the inner surfaces of the contact space as illustrated in FIG. 1. The higher temperature fill improves the mobility of the metallic fill material over those surfaces and is in sufficient quantity to substantially completely fill the contact space. The amount of the higher temperature fill material is chosen by the operator, depending upon the size of the contact space to be filled and by the relative flow qualities of the fill materials and the amorphous materials.

As an alternative, the deposition of metallic fill material may include sputter deposition followed by a pressure treatment of the fill material in an inert gas for example, current technology uses a pressure of at least about 700 atmospheres. The high pressure helps cause the metallic fill material to flow so that any voids formed during the deposition process will be filled by the flowing metallic fill material.

As another alternative, the deposition of metallic fill material may include sputter deposition followed by a post deposition anneal at a sufficiently high temperature and a duration long enough to allow the metallic fill to become viscous and flow to fill voids. For aluminum alloys, this would be a temperature of about 350° C. to about 650° C. for a time in the range of about 5 seconds to about 360 seconds. The high anneal temperatures enhance the mobility of the metallic fill material, allowing it to flow to fill voids.

A layer of energy-absorbing material such as titanium nitride, silicon carbide, pure carbon, or other carbon compounds that exhibit black body characteristics may optionally be deposited on the metallic fill material prior to anneal to improve the transmission of energy to the metallic fill material.

If the metallic fill material is an aluminum alloy, a film of pure aluminum may optionally be deposited before filling with the alloy to further promote mobility along the inner surfaces of the contact space. The above alternatives may also be used in various combinations.

An optional adhesion-promoting layer is presently preferred to be deposited before the deposition of the layer of the amorphous material. The adhesion-promoting layer should react with oxygen and carbon and other potential contaminants, binding them into the structure being formed. Refractory metals such as W, Co, and Ti and equivalents are preferred for the adhesion-promoting layer, most preferably titanium.

Figure 3:
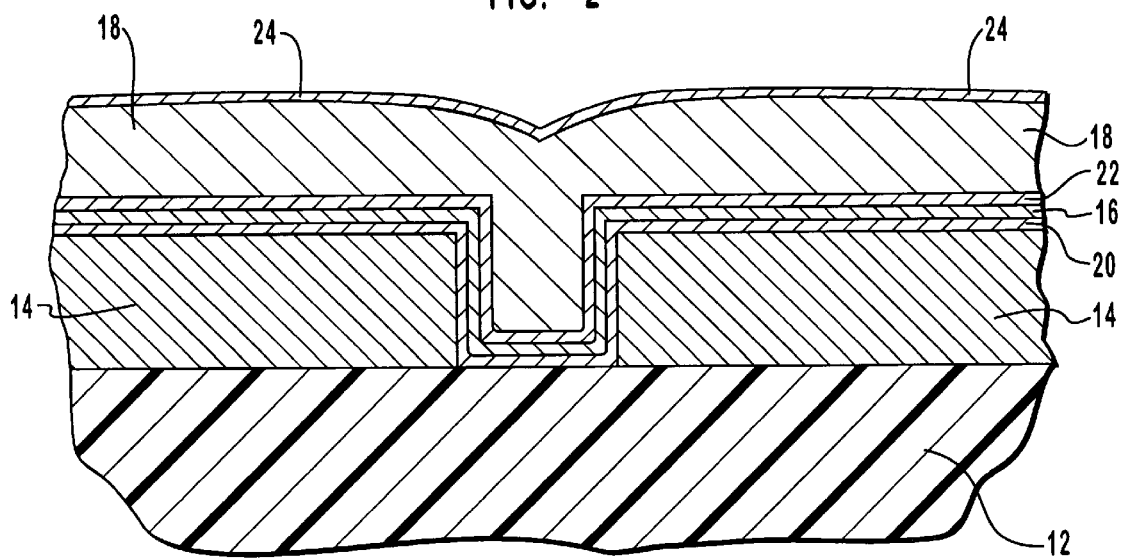
FIG. 3 is a partial cross section of a partially completed integrated circuit device showing layers that may be used in the practice of the methods of the present invention.

FIG. 3 shows a cross section of a partially completed integrated circuit device including some of the optional layers useful in the methods of the present invention.

A dielectric layer 14 on an underlying layer 12 has a contact space formed therethrough. A layer of adhesion-promoting material 20 such as titanium is deposited on the bottom and sidewalls of the contact space, followed by a layer 16 of TiAl or TiAl$_3$. Next, a flow-assisting layer 22 of pure aluminum is deposited. Other relatively low melting point substances may also be used. A metallic fill material 18 of an aluminum alloy is deposited to fill the contact space. A layer of energy absorbing material 24 is then deposited over metallic fill material 18 to assist in a subsequent anneal.

The present invention may be embodied in other specific forms without departing from its spirit or essential characteristics. The described embodiments are to be considered in all respects only as illustrative and not restrictive. The scope of the invention is, therefore, indicated by the appended claims and their whole or partial combinations rather than by the foregoing description. All changes that come within the meaning and range of equivalency of the claims are to be embraced within their scope.

What is claimed and desired to be secured by United States Letters Patent is:

1. A method of forming a contact structure comprising:
   forming, through a dielectric layer having a top surface, a contact space to be filled, said contact space having sidewalls and a bottom, said contact space exposing a semiconductor material;
   directionally depositing a layer of an amorphous material over the bottom and sidewalls of the contact space, said amorphous material being selected from the group consisting of a metallics, intermetallics, ceramics, their compounds and combinations thereof; and
   depositing a metallic fill material within said contact space.

2. The method as defined in claim 1, wherein said amorphous material comprises tantalum nitride and its compounds.

3. The method as defined in claim 1, wherein said amorphous material comprises tungsten nitride and its compounds.

4. The method as defined in claim 1, wherein said amorphous material comprises titanium aluminum nitride and its compounds.

5. The method as defined in claim 1, wherein said amorphous material comprises an intermetallic and its compounds.

6. The method as defined in claim 5, wherein said intermetallic comprises Ti$_x$Al$_y$.

7. The method as defined in claim 6, wherein said intermetallic comprises TiAl.

8. The method as defined in claim 6, wherein said intermetallic comprises TiAl$_3$.

9. The method as defined in claim 5, wherein said intermetallic comprises Ti$_x$Si$_y$.

10. The method as defined in claim 9, wherein said intermetallic comprises TiSi$_2$.

11. The method as defined in claim 1, wherein said metallic fill material comprises aluminum.

12. The method as defined in claim 1, wherein said metallic fill material comprises an aluminum alloy.

13. The method as defined in claim 1, wherein said metallic fill material comprises an aluminum-copper alloy.

14. The method as defined in claim 1, wherein said metallic fill material comprises an aluminum-germanium alloy.

15. The method as defined in claim 1, wherein said metallic fill material comprises an aluminum-silicon alloy.

16. The method as defined in claim 1, wherein said metallic fill material comprises an aluminum-copper-silicon alloy.

17. The method as defined in claim 1, wherein depositing a metallic fill material within said contact space comprises:
   depositing a first layer of said metallic fill material at a temperature less than about 200° C.; and
   depositing said metallic fill material to fill said contact space at a temperature not less than about 200° C.

18. The method as defined in claim 17, wherein depositing a first layer comprises depositing said first layer of said metallic fill material at a temperature between about 20° C. to less than about 200° C.

19. The method as defined in claim 1, wherein depositing a metallic fill material within said contact space comprises:
   depositing said metallic fill material in said contact space; and
   pressurizing said fill material in an inert gas whereby said metallic fill material flows to fill any voids formed during the deposition thereof.

20. The method as defined in claim 1, wherein depositing a metallic fill material within said contact space comprises:
   depositing Al or an Al alloy fill material in said contact space; and
   annealing said Al or Al alloy fill material at a temperature in the range of about 350° C. to about 650° C. for a time in the range of about 5 second to about 360 seconds.

21. The method as defined in claim 1, wherein depositing a metallic fill material within said contact space comprises:
   depositing said metallic fill material in said contact space; and annealing said metallic fill material at a temperature range and duration sufficient to allow said metallic fill material to become viscous and flow to fill voids.

22. The method as defined in claim 21, wherein depositing a metallic fill material within said contact space further comprises before annealing said metallic fill material:
depositing a layer of energy absorbent material on said metallic fill material deposited in said contact space.

23. The method as defined in claim 22, wherein said energy absorbent material comprises titanium nitride.

24. The method as defined in claim 22, wherein said energy absorbent material comprises silicon carbide.

25. The method as defined in claim 22, wherein said energy absorbent material comprises carbon.

26. The method as defined in claim 1, further comprising:
removing all material above said top surface of said dielectric layer.

27. The method as defined in claim 26, wherein removing all material above said top surface of said dielectric layer comprises an etch back.

28. The method as defined in claim 26, wherein removing all material above said top surface of said dielectric layer comprises a chemical mechanical polishing.

29. The method as defined in claim 1, further comprising after forming a contact space and before depositing a layer of an amorphous material:
depositing a layer of adhesion-promoting material, said adhesion-promoting material being capable of reacting with oxygen and carbon, whereby adhesion to said sides and said bottom of said contact space is promoted.

30. The method as defined in claim 29, further comprising after depositing a layer of an amorphous material:
depositing a flow-assisting layer upon said amorphous layer.

31. The method as defined in claim 29, wherein said adhesion promoting material comprises a refractory metal.

32. The method as defined in claim 31, wherein said refractory metal comprises titanium.

33. The method as defined in claim 1, wherein said contact space comprises a contact hole.

34. The method as defined in claim 1, wherein said contact space comprises a trench.

35. The method as defined in claim 1, wherein said contact space comprises a trench and a hole.

36. A method of forming a contact structure in the manufacture of a semiconductor device, said method comprising:
forming, through a dielectric layer having a top surface, a contact space to be filled, said contact space having sidewalls comprised of said dielectric layer and a bottom comprised of an underlying layer, said contact space exposing a semiconductor material, said dielectric layer being situated on a semiconductor wafer;
depositing a layer of an amorphous material over the bottom and sidewalls of the contact space;
depositing aluminum within said contact space; and
removing all material above the top surface of the dielectric layer.

37. The method according to claim 36, wherein depositing a layer of an amorphous material is a process selected from the group consisting of sputter depositing, CVD, high-density plasma deposition, electroplating depositing, and electrodeless plating deposition.

38. The method as defined in claim 37, wherein depositing a layer of an amorphous material over said bottom and said sidewalls of said contact space comprises sputter depositing a layer of an amorphous intermetallic over the bottom and sidewalls of the contact space from an intermetallic target.

39. The method as defined in claim 37, wherein depositing a layer of an amorphous compound or material over said bottom and said sidewalls of said contact space comprises sputter depositing a layer of an amorphous metallic and its compounds over the bottom and sidewalls of the contact space from a metallic target.

40. The method as defined in claim 37, wherein depositing a layer of an amorphous material over said bottom and said sidewalls of said contact space comprises sputter depositing a layer of an amorphous ceramic over the bottom and sidewalls of the contact space from a ceramic target.

41. A method of forming a contact structure in the manufacture of a semiconductor device, said method comprising:
forming, through a dielectric layer having a top surface, a contact space to be filled, said contact space having sidewalls comprised of said dielectric layer and a bottom comprised of an underlying layer, said contact space exposing a semiconductor material, said dielectric layer being situated on a semiconductor wafer;
depositing a layer of titanium conformably over the bottom and sidewalls of said contact space;
depositing a layer of amorphous $Ti_xAl_y$ conformably over the layer of titanium over the bottom and sidewalls of the contact space;
depositing a fill material comprising aluminum within said contact space; and
removing all material above the top surface of the dielectric layer.

42. The method as defined in claim 41, wherein depositing a layer of amorphous $Ti_xAl_y$ conformably over said layer of titanium over the bottom and sidewalls of the contact space comprises sputter depositing a layer of $Ti_xAl_y$ from a $Ti_xAl_y$ target conformably over said layer of titanium over the bottom and sidewalls of the contact space.

43. The method as defined in claim 41 wherein x is equal to about 1.0 and y is equal to about 3.0.

44. The method as defined in claim 42, wherein x is equal to about 1.0 and y is equal to about 3.0.

45. The method as defined in claim 41, further comprising, before depositing a fill material comprising aluminum and after depositing a layer of amorphous $Ti_xAl_y$ conformably over the bottom and sidewalls of said contact space:
depositing a layer of flow-promoting material, said flow-promoting material being composed of pure aluminum.

46. The method as defined in claim 45, wherein x is equal to about 1.0 and y is equal to about 3.0.

47. A method of making a contact comprising:
forming a contact hole in a dielectric layer terminating upon a substrate;
directionally depositing a liner within the contact hole and upon the substrate; and
filling the contact hole with a metallic fill material, wherein the Gibbs free energy of the potential reaction products of the liner and the metallic fill material does not favor reaction.

48. A method of making a contact comprising:
forming a contact hole in a dielectric layer terminating upon a substrate;
directionally depositing a liner of amorphous material within the contact hole and upon the substrate; and
filling the contact hole with a metallic fill material, wherein there is neither reaction nor reaction products between the liner of amorphous material and the metallic fill material.

49. A method of making a contact comprising:
forming a contact hole in a dielectric layer terminating upon a substrate;
directionally depositing a liner within the contact hole and upon the substrate; and
filling the contact hole with a metallic fill material, wherein the liner has substantially no crystalline reactive nucleation sites for a chemically reactive interaction between the liner and the metallic fill material.

50. A method of forming a contact structure comprising:
forming a contact space in a dielectric layer terminating upon a semiconductor material;
directionally depositing a liner within the contact space and upon the semiconductor material, the liner being composed of an amorphous material, wherein said amorphous material are selected from the group consisting of a metallics, intermetallics, ceramics, their compounds and combinations thereof; and
filling the contact space with a metallic fill material within said contact space, wherein the Gibbs free energy of the potential reaction products of the amorphous material and the metallic fill material does not favor reaction.

51. A method of forming a contact structure comprising:
forming a contact space in a dielectric layer terminating upon a semiconductor material;
directionally depositing a liner within the contact space and upon the semiconductor material, the liner being composed of an amorphous material, wherein said amorphous material are selected from the group consisting of a metallics, intermetallics, ceramics, their compounds and combinations thereof; and
filling the contact space with a metallic fill material within said contact space, wherein there is neither reaction nor reaction products between the amorphous material and the metallic fill material.

52. A method of forming a contact structure comprising:
forming a contact space in a dielectric layer terminating upon a semiconductor material;
directionally depositing a liner within the contact space and upon the semiconductor material, the liner being composed of an amorphous material, wherein said amorphous material are selected from the group consisting of a metallics, intermetallics, ceramics, their compounds and combinations thereof; and
filling the contact space with a metallic fill material within said contact space, wherein the amorphous material has substantially no crystalline reactive nucleation sites for a chemically reactive interaction between the amorphous material and the metallic fill material.

53. A method of forming a contact structure comprising:
forming, through a dielectric layer having a top surface, a contact space to be filled, said contact space having sidewalls and a bottom, said contact space exposing a semiconductor material;
directionally depositing a layer of an amorphous material over the bottom and sidewalls of the contact space, said amorphous material being selected from the group consisting of a metallics, intermetallics, ceramics, their compounds and combinations thereof; and
filling the contact space with a metallic fill material within said contact space, wherein the Gibbs free energy of the potential reaction products of the amorphous material and the metallic fill material does not favor reaction.

54. A method of forming a contact structure comprising:
forming, through a dielectric layer having a top surface, a contact space to be filled, said contact space having sidewalls and a bottom, said contact space exposing a semiconductor material;
directionally depositing a layer of an amorphous material over the bottom and sidewalls of the contact space, said amorphous material being selected from the group consisting of a metallics, intermetallics, ceramics, their compounds and combinations thereof; and
filling the contact space with a metallic fill material within said contact space, wherein there is neither reaction nor reaction products between the amorphous material and the metallic fill material.

55. A method of making a contact comprising:
forming a contact hole in a dielectric layer terminating upon a substrate;
directionally depositing a liner of amorphous material within the contact hole and upon the substrate; and
filling the contact hole with a metallic fill material, wherein:
the Gibbs free energy of the potential reaction products of the liner and the metallic fill material does not favor reaction;
there is neither reaction nor reaction products between the liner of amorphous material and the metallic fill material; and
the liner has substantially no crystalline reactive nucleation sites for a chemically reactive interaction between the liner and the metallic fill material.

56. A method of forming a contact structure comprising:
forming a contact space in a dielectric layer terminating upon a semiconductor material;
directionally depositing a liner within the contact space and upon the semiconductor material, the liner being composed of an amorphous material, wherein said amorphous material are selected from the group consisting of a metallics, intermetallics, ceramics, their compounds and combinations thereof; and
filling the contact space with a metallic fill material within said contact space, wherein:
the Gibbs free energy of the potential reaction products of the amorphous material and the metallic fill material does not favor reaction;
there is neither reaction nor reaction products between the amorphous material and the metallic fill material; and
the amorphous material has substantially no crystalline reactive nucleation sites for a chemically reactive interaction between the amorphous material and the metallic fill material.

57. A method of forming a contact structure comprising:
forming, through a dielectric layer having a top surface, a contact space to be filled, said contact space having sidewalls and a bottom, said contact space exposing a semiconductor material;
directionally depositing a layer of an amorphous material over the bottom and sidewalls of the contact space, said amorphous material being selected from the group consisting of a metallics, intermetallics, ceramics, their compounds and combinations thereof; and
filling the contact space with a metallic fill material within said contact space, wherein:
the Gibbs free energy of the potential reaction products of the amorphous material and the metallic fill material does not favor reaction;

there is neither reaction nor reaction products between the amorphous material and the metallic fill material; and the amorphous material has substantially no crystalline reactive nucleation sites for a chemically reactive interaction between the amorphous material and the metallic fill material.

58. A method of forming a contact structure comprising:

forming, through a dielectric layer having a top surface, a contact space to be filled, said contact space having sidewalls and a bottom, said contact space exposing a semiconductor material;

depositing a layer of adhesion-promoting material in the contact space, said adhesion-promoting material being capable of reacting with oxygen and carbon directionally depositing a layer of an amorphous material over the bottom and sidewalls of the contact space, wherein said amorphous material is selected from the group consisting of tantalum nitride and its compounds, tungsten nitride and its compounds, titanium aluminum nitride and its compounds, $Ti_xAl_y$, TiAl, $TiAl_3$, $Ti_xSi_y$, and $TiSi_2$;

depositing aluminum upon said amorphous layer; and depositing the metallic fill material within said contact space, wherein said metallic fill material comprises aluminum and alloys thereof; and pressurizing said metallic fill material in an inert gas to flow the metallic fill material into voids formed during the deposition thereof, wherein:

the Gibbs free energy of the potential reaction products of the amorphous material and the metallic fill material does not favor reaction;

there is neither reaction nor reaction products between the amorphous material and the metallic fill material; and the amorphous material has substantially no crystalline reactive nucleation sites for a chemically reactive interaction between the amorphous material and the metallic fill material;

depositing a layer of energy absorbent material on said metallic fill material deposited in said contact space, wherein said energy absorbent material is selected from the group consisting of titanium nitride, silicon carbide, carbon; and removing all material above said top surface of said dielectric layer.

59. A method of making a contact comprising:

forming a contact hole in a dielectric layer terminating upon a substrate;

directionally depositing an amorphous material within the contact hole upon the substrate; and filling the contact hole with a metal upon the amorphous material.

60. The method as defined in claim 1, wherein directionally depositing a layer of an amorphous material over the bottom and sidewalls of the contact space comprises sputter deposition from various directions to cover both the bottom and sidewalls of the contact space.

61. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, wherein said amorphous material comprises tantalum nitride and its compounds; and depositing a metallic fill material within said contact space.

62. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, wherein said amorphous material comprises tungsten nitride and its compounds; and depositing a metallic fill material within said contact space.

63. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, wherein said amorphous material comprises titanium aluminum nitride and its compounds; and depositing a metallic fill material within said contact space.

64. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, wherein said amorphous material comprises $Ti_xAl_y$; and depositing a metallic fill material within said contact space.

65. The method as defined in claim 64, wherein x and y both equal one.

66. The method as defined in claim 64, wherein x equals on and y equals 3.

67. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, said amorphous material being selected from the group consisting of a metallics, intermetallics, ceramics, their compounds and combinations thereof; and depositing a metallic fill material within said contact space, wherein said metallic fill material comprises an aluminum-germanium alloy.

68. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, said amorphous material being selected from the group consisting of a metallics, intermetallics, ceramics, their compounds and combinations thereof;

depositing a first layer of a metallic fill material at a temperature less than about 200° C.; and depositing said metallic fill material to fill said contact space at a temperature not less than about 200° C.

69. The method as defined in claim 68, wherein said step of depositing a first layer comprises depositing said first layer of said metallic fill material at a temperature between about 20° C. to less than about 200° C.

70. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, said amorphous material being selected from the group consisting of a metallics, intermetallics, ceramics, their compounds and combinations thereof;

depositing a metallic fill material in said contact space; and pressurizing said fill material in an inert gas whereby said metallic fill material flows to fill any voids formed during the deposition thereof.

71. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, said amorphous material being selected from the group consisting of a metallics, intermetallics, ceramics, their compounds and combinations thereof;

depositing Al or an Al alloy fill material in said contact space; and annealing said Al or Al alloy fill material at a temperature in the range of about 350° C. to about 650° C. for a time in the range of about 5 second to about 360 seconds.

72. A method of forming a contract structure comprising:

forming, through a dielectric layer having a top surface, a contact space to be filled, said contact space having sidewalls and a bottom, said contact space exposing a semiconductor material;

depositing a layer of an amorphous material over the bottom and sidewalls of the contact space, said amorphous material being selected from the group consisting of a metallics, intermetallics, ceramics, their compounds and combinations thereof;

depositing a metallic fill material in said contact space; and annealing said metallic fill material at a temperature range and duration sufficient to allow said metallic fill material to become viscous and flow to fill voids.

73. The method as defined in claim 72, wherein depositing a metallic fill material within said contact space further comprises before annealing said metallic fill material:

depositing a layer of energy absorbent material on said metallic fill material deposited in said contact space.

74. The method as defined in claim 72, wherein said energy absorbent material comprises titanium nitride.

75. The method as defined in claim 72, wherein said energy absorbent material comprises silicon carbide.

76. The method as defined in claim 73, wherein said energy absorbent material comprises carbon.

77. A method of forming a contract structure comprising:

forming, through a dielectric layer having a top surface, a contact space to be filled, said contact space having sidewalls and a bottom, said contact space exposing a semiconductor material;

depositing a layer of adhesion-promoting material, said adhesion-promoting material being capable of reacting with oxygen and carbon, whereby adhesion to said sides and said bottom of said contact space is promoted;

depositing a layer of an amorphous material over the bottom and sidewalls of the contact space, said amorphous material being selected from the group consisting of a metallics, intermetallics, ceramics, their compounds and combinations thereof; and depositing a metallic fill material within said contact space.

78. The method as defined in claim 77, further comprising after depositing a layer of an amorphous material:

depositing a flow-assisting layer upon said amorphous layer.

79. The method as defined in claim 77, wherein said adhesion promoting material comprises a refractory metal.

80. The method as defined in claim 79, wherein said refractory metal comprises titanium.

\* \* \* \* \*

UNITED STATES PATENT AND TRADEMARK OFFICE
CERTIFICATE OF CORRECTION

PATENT NO. : 5,956,612
DATED : Sep. 21, 1999
INVENTOR(S) : Richard L. Elliott; John H. Givens; Guy F. Hudson It is certified that error appears in the above-identified patent and that said Letters Patent is hereby corrected as shown below:

Col. 4, line 11, after "and" change "TIA1N" to --TiAlN--

Col. 5, line 66, after "of" delete "a"

Col. 6, line 63, after "5" change "second" to --seconds--

Col. 9, lines 20, 33, 46, and 62, after "of" delete "a"

Col. 9, line 32, change "material are" to --material is--

Col. 10, lines 9 and 39, after "of" delete "a"

Col. 10, line 26, after "liner" delete "of amorphous material"

Col. 10, line 38, change "material are" to --material is--

Col. 12, line 41, change "on and y equals 3." to --one and y equals three.--

Col. 12, lines 51 and 64, after "of" delete "a"

Col. 13, lines 15 and 31, after "of" delete "a"

Col. 14, lines 1 and 33, after "of" delete "a"

Signed and Sealed this

Thirty-first Day of October, 2000

Attest:

Q. TODD DICKINSON

*Attesting Officer*      *Director of Patents and Trademarks*